United States Patent [19]

Kosiec

[11] Patent Number: 5,801,567
[45] Date of Patent: Sep. 1, 1998

[54] CIRCUIT AND METHOD FOR GENERATING A DELAYED OUTPUT SIGNAL

[75] Inventor: Jeannie Han Kosiec, Schaumburg, Ill.

[73] Assignee: Motorola, Inc., Schaumburg, Ill.

[21] Appl. No.: 768,903

[22] Filed: Dec. 17, 1996

Related U.S. Application Data

[63] Continuation of Ser. No. 539,497, Oct. 6, 1995, abandoned, which is a continuation of Ser. No. 150,653, Nov. 9, 1993, abandoned.

[51] Int. Cl.$^6$ .................................................. H03K 5/13
[52] U.S. Cl. .......................... 327/263; 327/264; 327/284; 327/288
[58] Field of Search ................................. 307/603, 605, 307/263, 246, 567, 568, 597, 594; 327/270, 271, 276, 277, 278, 284, 272, 283, 285, 288, 170, 392, 393, 394, 327, 328, 395, 400, 263, 264

[56] References Cited

U.S. PATENT DOCUMENTS

| | | | |
|---|---|---|---|
| 3,331,967 | 7/1967 | Moore | 327/400 |
| 4,090,096 | 5/1978 | Nagami | 307/246 |
| 4,322,643 | 3/1982 | Preslar | 307/528 |
| 4,378,509 | 3/1983 | Hatchett et al. | 307/528 |
| 4,584,494 | 4/1986 | Arakaw et al. | 327/394 |
| 4,707,626 | 11/1987 | Inoue | 307/625 |
| 4,728,829 | 3/1988 | Tsujimoto | 327/394 |
| 4,943,745 | 7/1990 | Watanabe et al. | 307/597 |
| 5,055,706 | 10/1991 | Nakai et al. | 307/603 |
| 5,130,582 | 7/1992 | Ishihara et al. | 307/603 |
| 5,175,452 | 12/1992 | Lupi et al. | 307/603 |
| 5,182,479 | 1/1993 | Behagel et al. | 327/394 |
| 5,191,245 | 3/1993 | Kang | 327/263 |
| 5,216,289 | 6/1993 | Hahn et al. | 307/263 |

FOREIGN PATENT DOCUMENTS

| | | | |
|---|---|---|---|
| 0176214 | 4/1986 | European Pat. Off. | 327/263 |
| 3839888 | 6/1989 | Germany | H03K 5/13 |
| 860290001 | 4/1986 | Japan | H03K 3/023 |
| 890157632 | 6/1989 | Japan | H03K 5/04 |

OTHER PUBLICATIONS

Motorola Technical Developments, vol. 6 Oct. 1986, pp. 26–27.

Kim, Daejeong; Kih, Joongsik; and Kim Wonchan; "A New Waveform-Reshaping Circuit: An Alternative Approach to Schmitt Trigger", *IEEE Journal of Solid-State Circuits*, vol. 28, No. 2, Feb. 1993, pp. 162–164.

*Primary Examiner*—Timothy P. Callahan
*Assistant Examiner*—Eunja Shin
*Attorney, Agent, or Firm*—John J. King

[57] ABSTRACT

The present invention provides a circuit (10) and method for providing a delayed output signal which is less sensitive to supply variation compared to conventional circuits, has high noise immunity, can be operated at high frequency, and occupies a minimum area on the semiconductor. The delay is provided according to the present invention by separately controlling the discharge currents of a capacitor (26) before and after the trip point voltage of an output inverter (16) of the circuit (10) has been reached. The delay interval is determined primarily by the capacitor value, the voltage difference between the supply and the trip point of the output inverter, and the first discharge current, set by a resistor (24) in series with a transistor (34). The second discharge current is set by a switch (36) having a series of transistors (38, 40).

6 Claims, 3 Drawing Sheets

CIRCUIT AND METHOD FOR GENERATING A DELAYED OUTPUT SIGNAL

This is a continuation of application Ser. No. 08/539,497, filed Oct. 6, 1995 and now abandoned, which is a continuation of application Ser. No. 08/150,653, filed Nov. 9, 1993 and now abandoned.

FIELD OF THE INVENTION

The present invention is generally related to delay circuits, and more particularly to a circuit and method for generating an output signal which is a delayed input signal.

BACKGROUND OF THE INVENTION

Delay elements are frequently used in circuit designs for pulse shaping, synchronization, and timing control. As device fabrication techniques have pushed gate delays into the picosecond range, the conventional method of stringing many inverters in series to obtain a controlled signal delay has become impractical. That is, the number of inverters required to generate the delay is costly and will occupy valuable area on the semiconductor substrate.

Capacitors or resistor and capacitor combinations have been introduced into the inverter string to increase the signal delay through each inverter. However, the noise immunity of an inverter will degrade with the additional capacitance. That is, the inverter input signal voltage will cross the inverter trip point at a slower rate, making the total delay time through the delay element sensitive to noise. In addition, because of the symmetrical charging and discharging time of the capacitor, the highest operating frequency of these delay elements decreases at twice the rate as the desired delay time increases.

To improve the delay path noise immunity, the inverters in the delay path are often replaced by Schmitt triggers to prevent undesirable switching. However, Schmitt triggers in the delay path increase delay time sensitivity to supply level variation and reduce operating frequency.

Accordingly, there is a need to provide a delay element which is less sensitive to supply variation, has high noise immunity, can be operated at high frequency, and consumes minimum area for the desired signal delay.

DESCRIPTION OF THE PREFERRED EMBODIMENT

The present invention provides a circuit and method for providing a delayed output signal which is less sensitive to supply variation compared to conventional circuits, has high noise immunity, can be operated at high frequency, and occupies a minimum area on the semiconductor. The delay is provided according to the present invention by separately controlling the discharge currents of a capacitor before and after the trip point voltage of an output inverter of the circuit has been reached. The delay interval is determined primarily by the capacitor value, the voltage difference between the supply and the trip point of the output inverter, and the first discharge current which is set by a resistor in series with a transistor. The second discharge current is set by a switch having a series of transistors.

The delay time can be easily scaled by adjusting the capacitor and resistor values. The noise immunity of this delay element is greatly improved by the employment of the feedback signal to drastically discharge the capacitor voltage through the second discharge current path when the output inverter is near its trip point. Finally, the high frequency operation of the delay element is achieved through the separation of the charge and discharge current paths, and thereby allowing a fast reset of the delay element.

Figure 1:
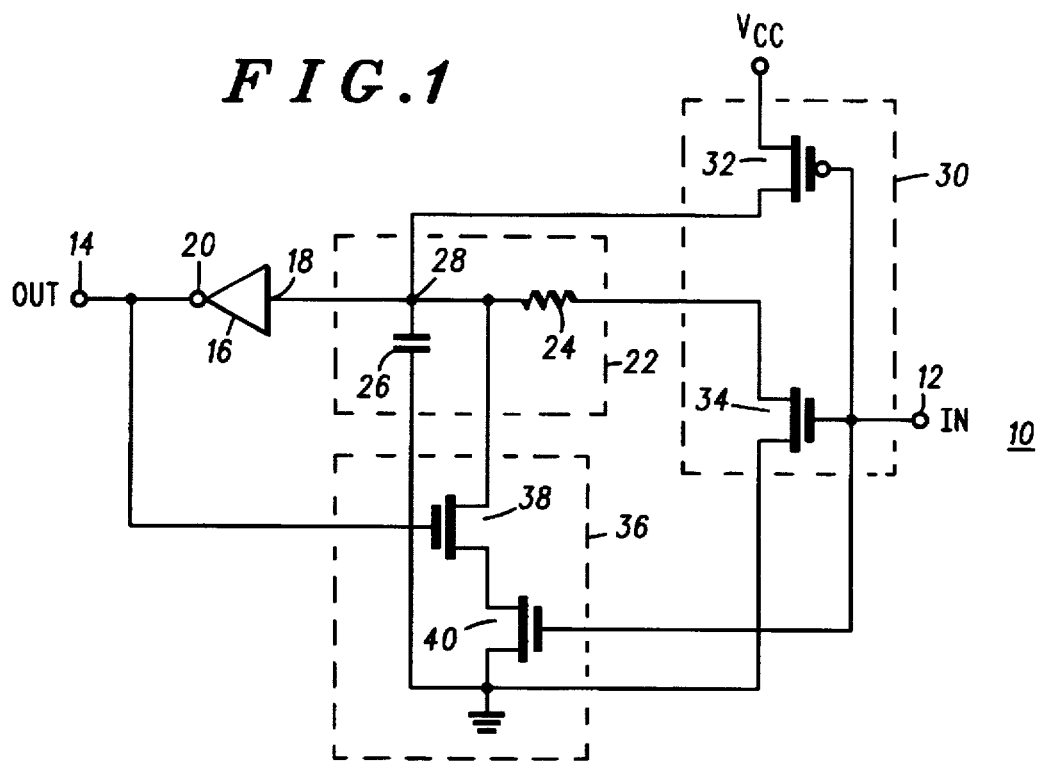
FIG. 1 is a circuit diagram of a delay circuit according to the present invention.
Figure 2:
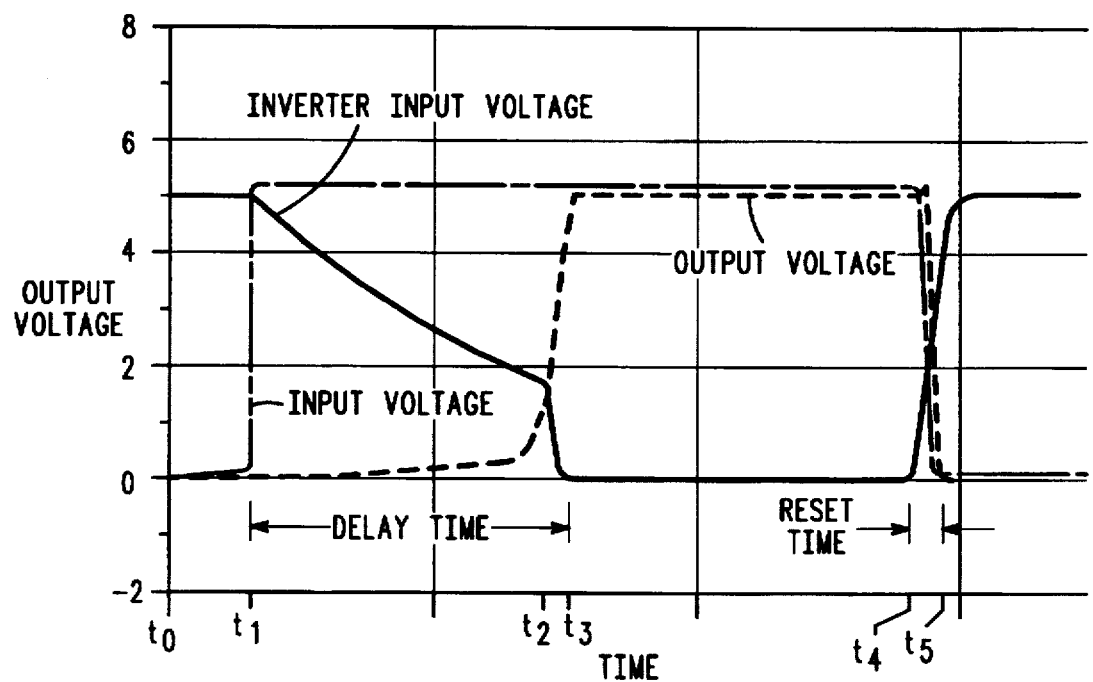
FIG. 2 is a plot of input and output voltages of the circuit of FIG. 1 as a function of time.

The present invention can be more fully described with reference to FIGS. 1-3. FIG. 1 illustrates a delay circuit according to the present invention. In particular, delay circuit 10 receives an input signal at an input 12 and generates an output signal at an output 14. Delay circuit 10 also includes an inverter 16 having an input 18 and an output 20 coupled to circuit output 14. The circuit also includes a delay element 22. Delay element 22 preferably employs a resistor-capacitor (RC) network having a resistor 24 and a capacitor 26 coupled at a node 28 to inverter input 18. Delay element 22 generally sets the delay time through the delay circuit 10.

An input stage 30 is coupled to receive an input signal at input 12. Input stage 30 consists of a transistor 32 coupled to capacitor 26 at node 28 in the delay stage 22. Transistor 32 has a control electrode and a path of controllable conductivity between a first potential (Vcc) and a node 28. The input stage also includes a transistor 34 coupled to the resistor 24 in the delay stage 22 and coupled to a second potential (GND). Transistor 34 acts as a discharging element and has a control electrode coupled to receive the input signal to control a first discharge path to discharge capacitor 26 by way of resistor 24. The function of resistor 24 can be implemented by scaling the conductivity of the transistor 34. However, in an integrated circuit approach, the wafer area is best conserved by a separate resistor in implementing the delay element of the present invention.

Finally, a switch element 36 which is coupled to receive the input signal from input 12 and the output signal from output 14 to produce a second discharging path. Switch element 36 consists of two switches coupled in series. The switches are preferably transistors, but any device which can be controlled to provide a current path can be used. A first switch, transistor 38 is in series with node 28 of the delay stage 22 and the second switch, transistor 40, and is coupled to receive the output signal 14. Transistor 40 is in series with the transistor 38 and the ground potential where the potential of capacitor 26 is to be discharged to, and is coupled to receive the input signal at input 12. The particular arrangement of the two transistors ensures a fast switching of the switch element 36.

Although the preferred embodiment discloses MOS transistors throughout the circuit, it will be understood that bipolar transistors could also be used. Similarly, the polarity of the input and output signal, and therefore, the type of transistor (for example, the channel type for a MOS transistor) employed in the circuit could be reversed within the scope of the present invention.

Having described the structure of the circuit in reference to FIG. 1, the operation of the circuit will be described in detail in reference to FIG. 2. FIG. 2 illustrates a timing diagram showing an input signal, the capacitor voltage at node 28, and the output signal generated at node 14 of FIG. 1. At time t0, the input signal is low, and the capacitor 26 is fully charged to Vcc by the transistor 32. While a five volt Vcc is shown by way of example in FIG. 2, it will be understood that any other power supply voltage could be used. At time t1, the input signal is pulled high, turning off transistor 32 and turning on transistor 34 and transistor 40. Between time t1 and time t2, the voltage on the capacitor 26 at node 28 decreases at a first rate set by the first discharge current path formed by transistor 34 and the resistor 24. The output inverter 16 produces the output signal at output 14 in response to the decreasing capacitor voltage at the first rate, until the output signal reaches the threshold of transistor 38 of switch element 36, and thereby turning on transistor 38 at time t2 to form the second discharge current path with transistor 40. From time t2 to t3, the capacitor voltage at node 28 discharges at a second rate due to the additional discharge current supplied by the second discharge current path through switch 36.

In the preferred embodiment, the conductance of the second discharge current path is much greater than that of the first discharge current path, forcing the second discharge rate to be much higher compared to the first discharge rate. The second discharge current path forces the input voltage at the inverter to travel quickly through the trip point of the inverter, preventing noise from disturbing the total delay time through the delay element 10.

At time t4, the input signal is again pulled low, turning off transistors 34 and 40 to open the first and the second discharge current paths, and turning on transistor 32. The voltage of the capacitor at node 28 is charged quickly to Vcc at a third rate by transistor 32 between time t4 and t5. The delay element is said to be ready to receive another state change at input 12 after time t5.

Figure 3:
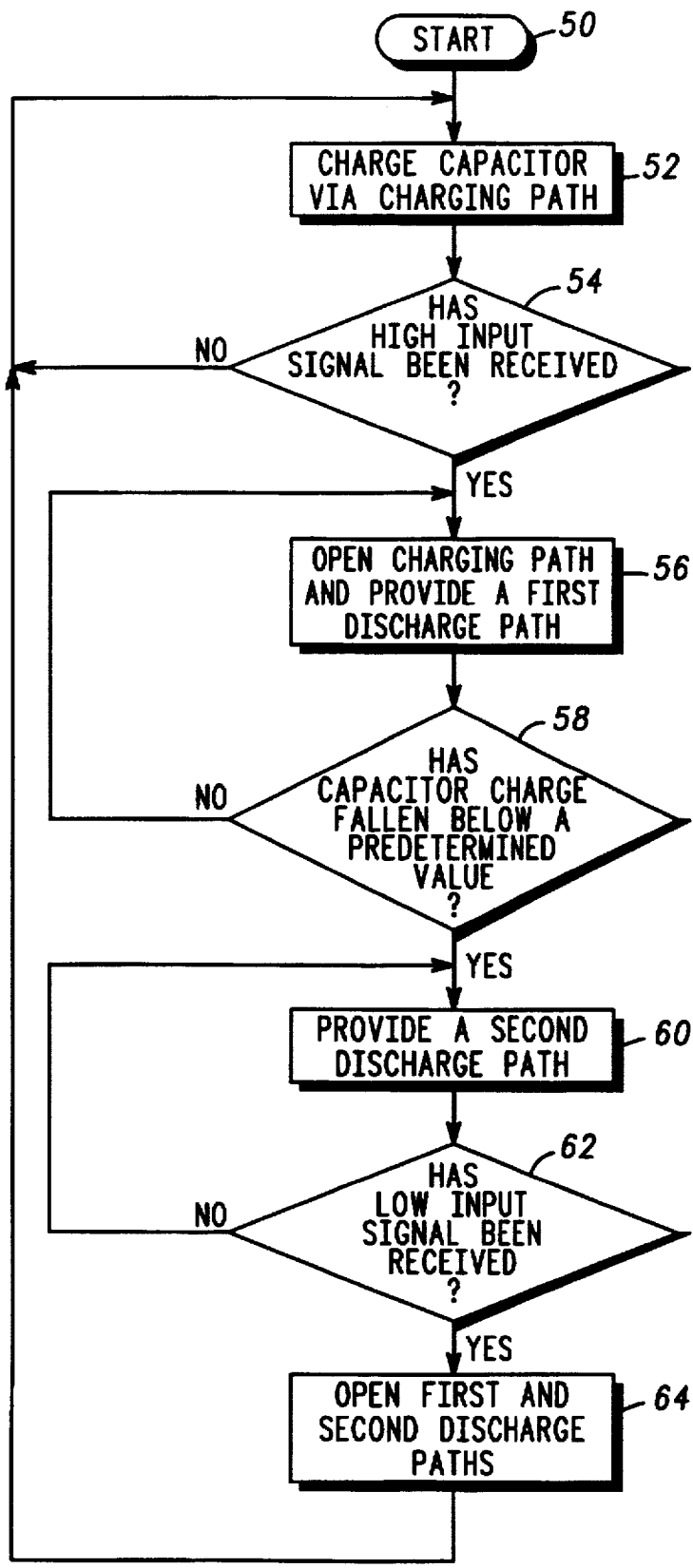
FIG. 3 is a flow chart of a method for generating a delayed output signal according to the present invention.

Turning now to FIG. 3, a flow chart shows a method according the invention for providing a delay element. At a first step 50, the delay element or a device incorporating the delay element is provided with power. At a step 52, a current path is provided and a capacitor or other device for maintaining a charge is charged via a charging path. Preferably, a current path is provided when a first input signal is received, for example a low input signal. While the polarity of the input signals will be used by way of example, it will be understood that the inverse polarities could employed within the scope of the present invention.

At a step 54, the state of the input signal is determined. If a state change of the input signal has not occurred, the circuit will continue to charge the capacitor at step 52. However, if a state change of the input signal has occurred and a high input signal has been received, a first discharge path is provided. Preferably, the first discharge path is a path of controllable conductivity. Accordingly, a first rate of discharge of the capacitor can be established at step 56.

At a step 58, the charge on the capacitor is monitored to determine whether the charge has fallen below a predetermined value. If the charge has not fallen below the predetermined value, only a first discharge path at step 56. However, if the charge of the capacitor has fallen below the predetermined value, a second discharge path can be provided at a step 60. Preferably, the second discharge path is provided in addition to the first discharge path. Also, the second discharge path has low resistance and provides for rapid discharge of the capacitor. The discharge paths are provided until a low input signal is received at a step 62, at which time the discharge paths are opened at a step 64 and the capacitor is charged via the charging path at step 52.

Figure 4:
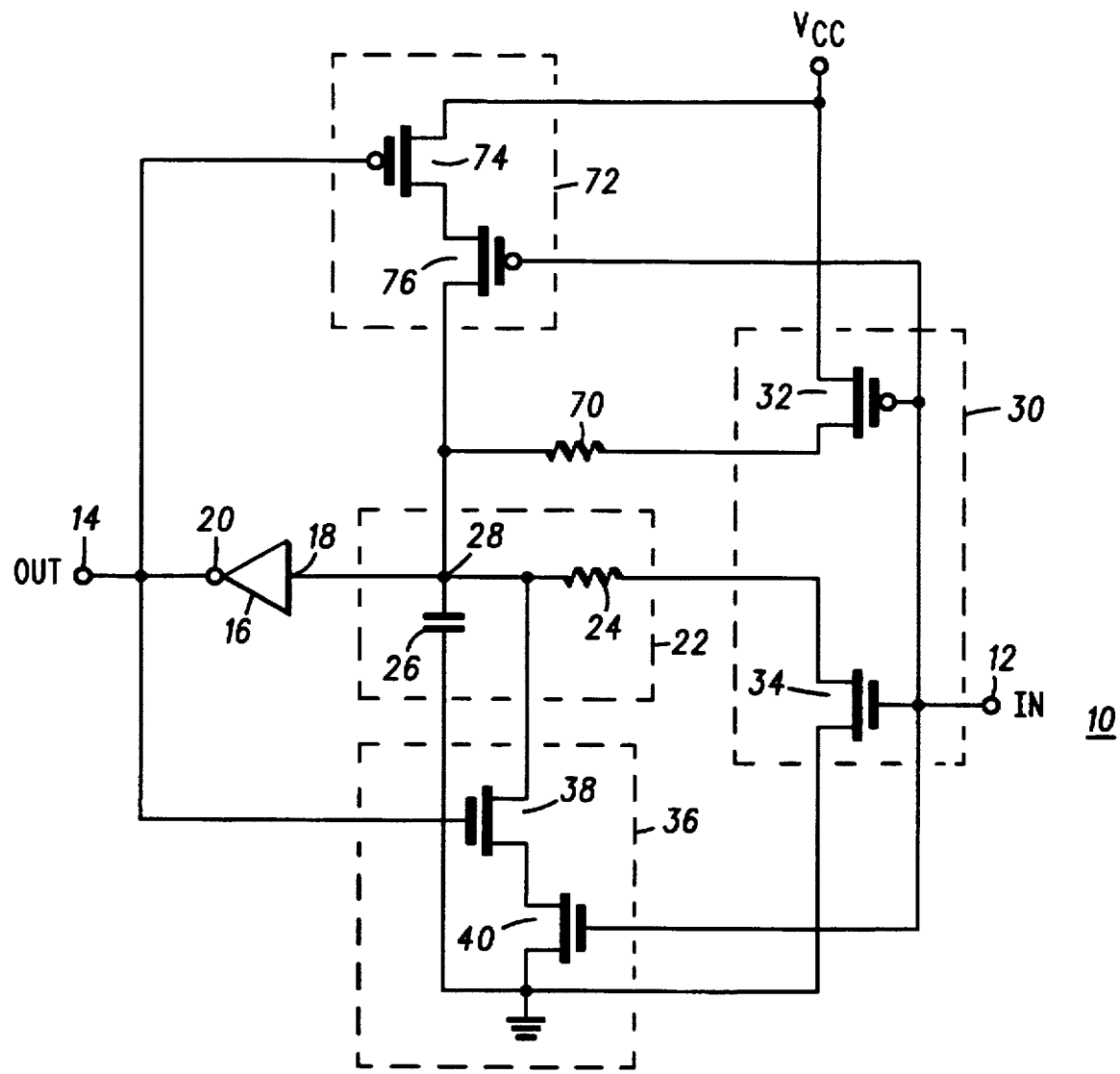
FIG. 4 is circuit diagram of an alternate embodient of a delay circuit according to the present invention.

Turning now to FIG. 4, an alternate embodiment of the present invention is shown. While the circuit described in FIG. 1 provides delay length control for the rising edge of the input, the charging current can also be separately controlled before and after the trip point voltage of an output inverter of the circuit has been reached to provide further delay control for the falling edge of the input within the scope of the invention. The charging currents before and after the trip point voltage of an output inverter of the circuit has been reached may charge the capacitor at a third and fourth rate.

The charging of capacitor 26 can be controlled at a third rate by inserting a resistor 70 in the path of controllable conductivity between transistor 32 and capacitor 26. Also, a second switch 72 having transistors 74 and 76 can be added to provide a second path to charge capacitor 26. The control electrode of transistor 76 is coupled to the input signal. The control electrode of transistor 74 is coupled to receive the output signal. The noise immunity of the delay element will be retained if the fourth charging rate is high enough such that the voltage travels fast through the trip point of the inverter.

In summary, the present invention provides a delay circuit and a method for generating an output signal. The resulting circuit is suitable for a high speed, low noise, and constant delay application, and is an area efficient solution for a desired signal delay for an integrated circuit application. The advantage of this invention is provided by the two sequentially operated discharge current paths for the delay element. The delay time is set by the slow discharge current path which has a current limiting resistor, and the noise immunity of the circuit is achieved by the fast discharge current path which is controlled via a feedback signal which is the output of the delay element. This delay element can be operated at a high speed due to the separate charge and discharge current paths for the delay element, providing a controlled signal delay time through the delay element via the discharge current paths, and a fast reset of the delay element via the charge current path.

I claim:

1. A delay element having an input to receive an input signal and an output to generate an output signal, said delay element comprising:
   a capacitor;
   an inverter coupled to said capacitor at a first node and said output
   a first transistor having a control electrode coupled to receive said input signal and a path of controllable conductivity between a first potential and said first node and coupled in series with a first resistor for providing a first path between said first potential and said first node to charge said capacitor at a first charging rate;
   a second transistor providing a second path, responsive to said input signal, between said first node and a second potential to discharge said capacitor at a first discharging rate which is different from said first charging rate; and
   a third transistor having a third control electrode coupled to said input and in series with a fourth transistor having a fourth control electrode coupled to said output, said third transistor and said fourth transistor providing a third path, responsive to said input signal and said output signal for providing a current path separate from said second path, between said first node and said second potential to discharge said capacitor.

2. The delay element according to claim 1 wherein said second path provides a path having a second resistor coupled in series with said second transistor to discharge said capacitor at said first discharging rate.

3. The delay element according to claim 1 wherein said second path comprises a second resistor and said second transistor, said second transistor having a control electrode coupled to receive said input signal and a path of controllable conductivity in series with said second resistor to provide a path from said capacitor to said second potential.

4. A delay element having an input to receive an input signal and an output to generate an output signal, said delay element comprising;

a capacitor;

an inverter coupled to said capacitor at a first node and said output;

a first transistor providing a first path, responsive to said input signal, between a first potential and said first node to charge said capacitor at a first charging rate;

a second transistor providing a second path, responsive to said input signal, between said first node and a second potential to discharge said capacitor at a first discharging rate which is different from said first charging rate;

a third transistor having a third control electrode coupled to said input and in series with a fourth transistor having a fourth control electrode coupled to said output, said third transistor and said fourth transistor providing a third path, responsive to said input signal and said output signal for providing a current path separate from said second path, between said first node and said second potential to discharge said capacitor, and a fourth path, responsive to said input signal and said output signal, between said first potential and said first node to charge said capacitor at a second charging rate.

5. The delay element according to claim 4 wherein said fourth path comprises a second switch device coupled to receive said output signal and to provide a path between said capacitor and said first potential.

6. The delay element according to claim 5 wherein said second switch device includes a fifth transistor and a sixth transistor each having a control electrode and a path of controllable conductivity, said control electrode of said fifth transistor being coupled to receive said output signal and said control electrode of said sixth transistor being coupled to receive said input signal.

* * * * *